United States Patent
Chen et al.

(10) Patent No.: US 12,439,609 B2
(45) Date of Patent: Oct. 7, 2025

(54) PROCESS TECHNIQUE FOR EMBEDDED MEMORY

(71) Applicant: HEFEI RELIANCE MEMORY LIMITED, Hefei (CN)

(72) Inventors: Chao-Yang Chen, Hefei (CN); Wen-Hsiung Chang, Hefei (CN); Zezhi Chen, Hefei (CN); Zhichao Lu, San Jose, CA (US)

(73) Assignee: HEFEI RELIANCE MEMORY LIMITED, Hefei (CN)

( * ) Notice: Subject to any disclaimer, the term of this patent is extended or adjusted under 35 U.S.C. 154(b) by 0 days.

(21) Appl. No.: 18/910,873

(22) Filed: Oct. 9, 2024

(65) Prior Publication Data
US 2025/0098178 A1    Mar. 20, 2025

Related U.S. Application Data

(63) Continuation of application No. PCT/CN2023/119564, filed on Sep. 19, 2023.

(51) Int. Cl.
| | |
|---|---|
| H10N 70/00 | (2023.01) |
| H10B 63/00 | (2023.01) |
| H10N 70/20 | (2023.01) |

(52) U.S. Cl.
CPC ........... *H10B 63/22* (2023.02); *H10N 70/021* (2023.02); *H10N 70/20* (2023.02); *H10N 70/841* (2023.02)

(58) Field of Classification Search
CPC .... H10N 70/021; H10N 70/20; H10N 70/841; H10B 63/22
See application file for complete search history.

(56) References Cited

U.S. PATENT DOCUMENTS

| | | | |
|---|---|---|---|
| 10,134,809 B2 | 11/2018 | Bernhardt et al. | |
| 11,183,632 B2 | 11/2021 | Ando et al. | |

(Continued)

FOREIGN PATENT DOCUMENTS

| | | |
|---|---|---|
| CN | 108307662 A | 7/2018 |
| CN | 109545745 A | 3/2019 |

(Continued)

OTHER PUBLICATIONS

PCT International Search Report and the Written Opinion mailed Dec. 22, 2023, issued in related International Application No. PCT/CN2023/119564 (8 pages).

(Continued)

*Primary Examiner* — Mark V Prenty
(74) *Attorney, Agent, or Firm* — Sheppard Mullin Richter & Hampton LLP

(57) ABSTRACT

A single integrated circuit is provided, comprising a memory region and a non-memory region. The memory region comprises a first conductive structure, a memory element disposed upon the first conductive structure, and a first via disposed upon the memory element. The non-memory region comprises a second conductive structure, and a second via disposed upon the second conductive structure. The first conductive structure and the second conductive structure are formed by a first photolithography process comprising a first photomask, and the first conductive structure is configured to be a first bottom electrode in the memory region. The first via and the second via are formed by a third photolithography process comprising a third photomask. The first photomask and the third photomask comprise a same pattern.

5 Claims, 6 Drawing Sheets

(56) References Cited

U.S. PATENT DOCUMENTS

| | | |
|---|---|---|
| 2022/0285376 A1 | 9/2022 | Chen et al. |
| 2025/0098178 A1* | 3/2025 | Chen .................... H10B 63/22 |
| 2025/0140744 A1 | 5/2025 | Jeng et al. |

FOREIGN PATENT DOCUMENTS

| | | |
|---|---|---|
| CN | 111613572 A | 9/2020 |
| CN | 114846636 A | 8/2022 |
| TW | 202218103 A | 5/2022 |

OTHER PUBLICATIONS

Search Report dated Jun. 18, 2025, issued in related Taiwan Application No. 113134271.

* cited by examiner

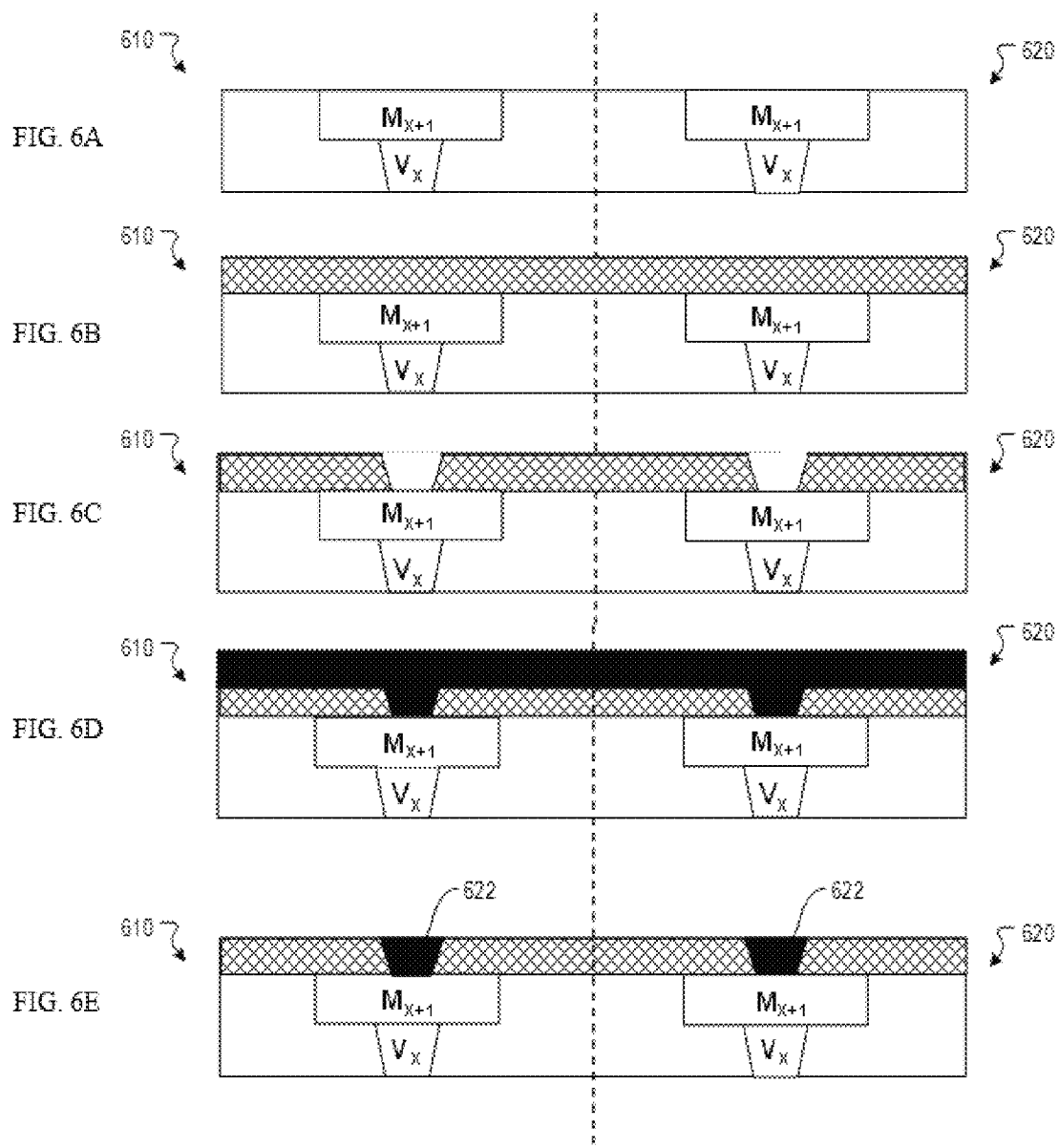

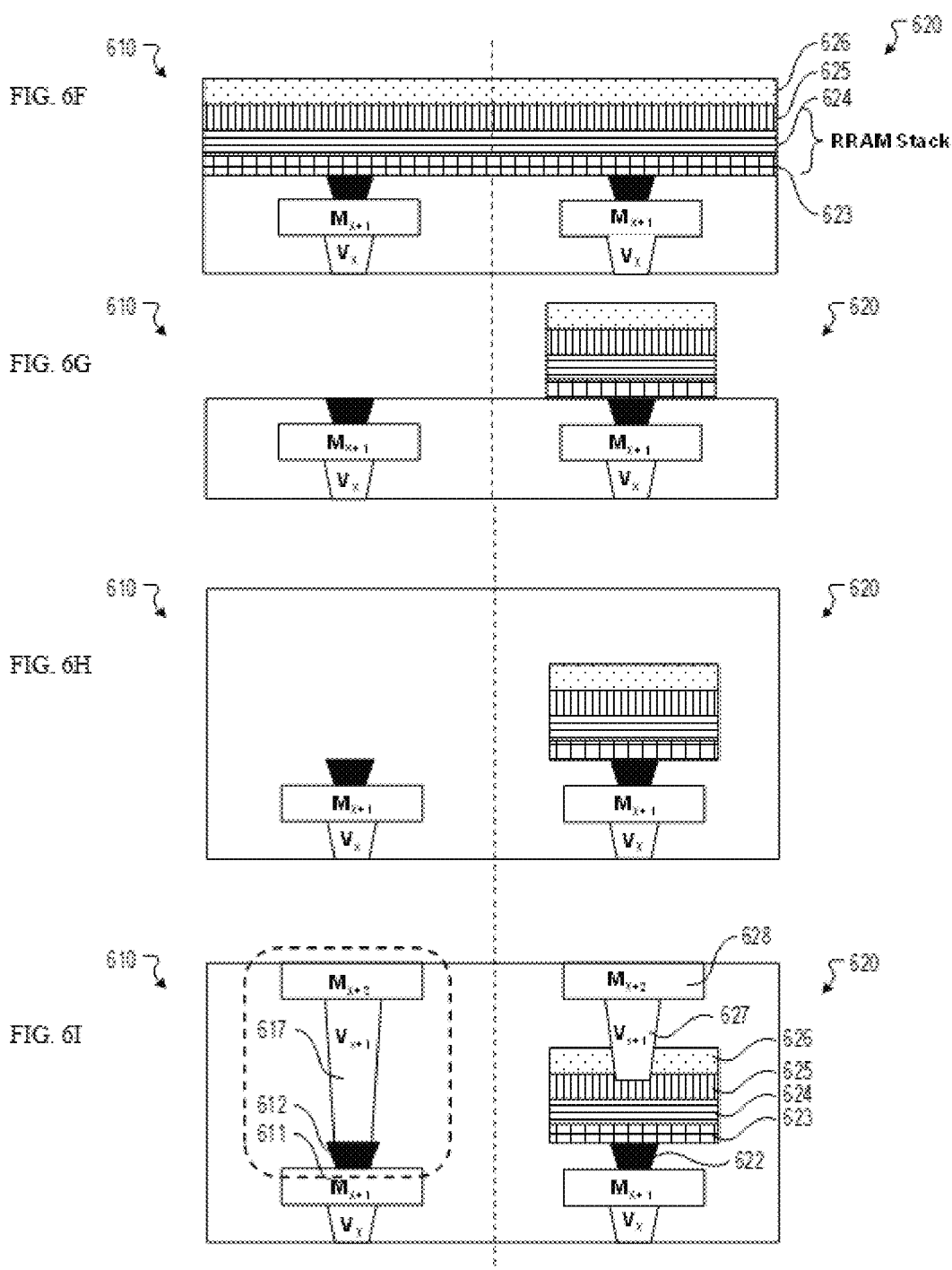

PROCESS TECHNIQUE FOR EMBEDDED MEMORY

CROSS REFERENCE TO RELATED APPLICATION

This application is a continuation application of International Patent Application No. PCT/CN2023/119564, filed with the China National Intellectual Property Administration on Sep. 19, 2023, titled "Novel Process Technique for Embedded Memory," the content of which is incorporated herein by reference in its entirety.

TECHNICAL FIELD

The present invention relates generally to a new process technique for embedded memory, and more specifically to embedded memory integration technology that reduces photomask costs.

BACKGROUND

Resistive random access memory (RRAM) is a type of non-volatile memory where the device resistance can be changed to low resistance state (LRS) or high resistance state (HRS) by applying proper voltage to the device. The difference in resistance (LRS vs HRS) can be utilized to store the digital data "0" and "1".

RRAM is a universal memory technology. It can be utilized as standalone memory and embedded memory as well. In terms of embedded memory, RRAM requires extra photomasks for RRAM to be successfully integrated into integrated circuit (IC). Conventional RRAM process require extra 2~3 photomasks to be integrated into IC chip.

In semiconductor processing, photomasks take up a huge portion of the overall process cost, and this portion is getting bigger as processes are moving to more and more advanced nodes. Therefore, processes with fewer number of photomasks become very attractive. This is a big advantage for non-volatile memories, as this type of memory technology requires much fewer photomasks comparing to conventional embedded non-volatile memory (typically based on embedded flash technology) which requires >10 extra photomasks. In conventional embedded RRAM process flow, two or more extra photomasks are required where the first mask is used for defining RRAM bottom electrode (BE) while the second mask is used for defining where to put the RRAM cells.

SUMMARY

According to a first aspect of the present invention, a single integrated circuit is provided, including a memory region and a non-memory region. The memory region includes a first conductive structure, a memory element disposed upon the first conductive structure, and a first via disposed upon the memory element. The non-memory region includes a second conductive structure, and a second via disposed upon the second conductive structure. The first conductive structure and the second conductive structure are formed by a first photolithography process comprising a first photomask, and the first conductive structure is configured to be a first bottom electrode in the memory region.

In some embodiments, the memory element includes a dielectric layer disposed upon the first bottom electrode; a capping layer disposed upon the dielectric layer; and a top electrode disposed upon the capping layer.

In some embodiments, the memory region further includes a stacked bottom electrode disposed upon the first bottom electrode.

In some embodiments, the memory region further includes a first top metal layer disposed upon the first via.

In some embodiments, the memory region further includes a first bottom metal layer. The first bottom electrode is disposed upon the first bottom metal layer.

In some embodiments, the non-memory region further includes a first top metal layer disposed upon the second via.

In some embodiments, the non-memory region further includes a second bottom metal layer. The second conductive structure is disposed upon the second bottom metal layer.

In some embodiments, the first bottom metal layer and the second bottom metal layer are formed using a first metallization process.

In some embodiments, the first top metal layer and the second top metal layer are formed using a second metallization process.

In some embodiments, the second via does not enclose sides of the second conductive structure.

In some embodiments, the second via partially encloses sides of the second conductive structure.

In some embodiments, the second via completely encloses sides of the second conductive structure.

In some embodiments, a plurality of the second conductive structures are disposed upon a single second bottom metal layer in the non-memory region.

In some embodiments, only a single first bottom electrode is disposed upon a single first bottom metal layer in the memory region.

In some embodiments, the memory element is one of: a resistive random access memory (RRAM); a conductive-bridge random access memory (CBRAM); a magnetic random access memory (MRAM); a ferroelectric random access memory (FeRAM); and a phase change random access memory (PCRAM).

In some embodiments, the first via and the second via are formed by a third photolithography process comprising a third photomask.

In some embodiments, the first photomask and the third photomask comprise a same pattern.

According to a second aspect of the present invention, a method for manufacturing an integrated circuit is provided, including: defining a memory region and a non-memory region on a semiconductor wafer; depositing a first interlayer dielectric layer on a first bottom metal layer in the memory region and a second bottom metal layer in the non-memory region; forming a first conductive structure in the memory region and a second conductive structure in the non-memory region by etching the first interlayer dielectric layer using a first photolithography process comprising a first photomask, wherein the first conductive structure is configured to be a first bottom electrode in the memory region; depositing a memory stack layer in the memory region and the non-memory region; forming a memory element in the memory region by etching the memory stack layer using a second photolithography process comprising a second photomask; depositing a second interlayer dielectric layer in the memory region and the non-memory region; and forming a first via in the memory region and a second via in the non-memory region by etching the second interlayer dielectric layer using a third photolithography process comprising a third photomask. The first photomask and the third photomask include a same pattern.

In some embodiments, the memory stack layer includes a dielectric layer; a capping layer; and a top electrode layer.

In some embodiments, the memory stack layer further includes a bottom electrode layer.

In some embodiments, the method further including forming the first bottom metal layer in the memory region and the second bottom metal layer in the non-memory region using a first metallization process.

In some embodiments, the method further including forming a first top metal layer in the memory region and a second top metal layer in the non-memory region using a second metallization process.

BRIEF DESCRIPTION OF THE DRAWINGS

Non-limiting embodiments of the present invention may be more readily understood by referring to the following drawings.

FIG. 6A-FIG. 6I are schematic diagrams illustrating a novel process flow for embedded RRAM in accordance with embodiments of the present invention.

DETAILED DESCRIPTION OF THE EMBODIMENTS

Figure 1:
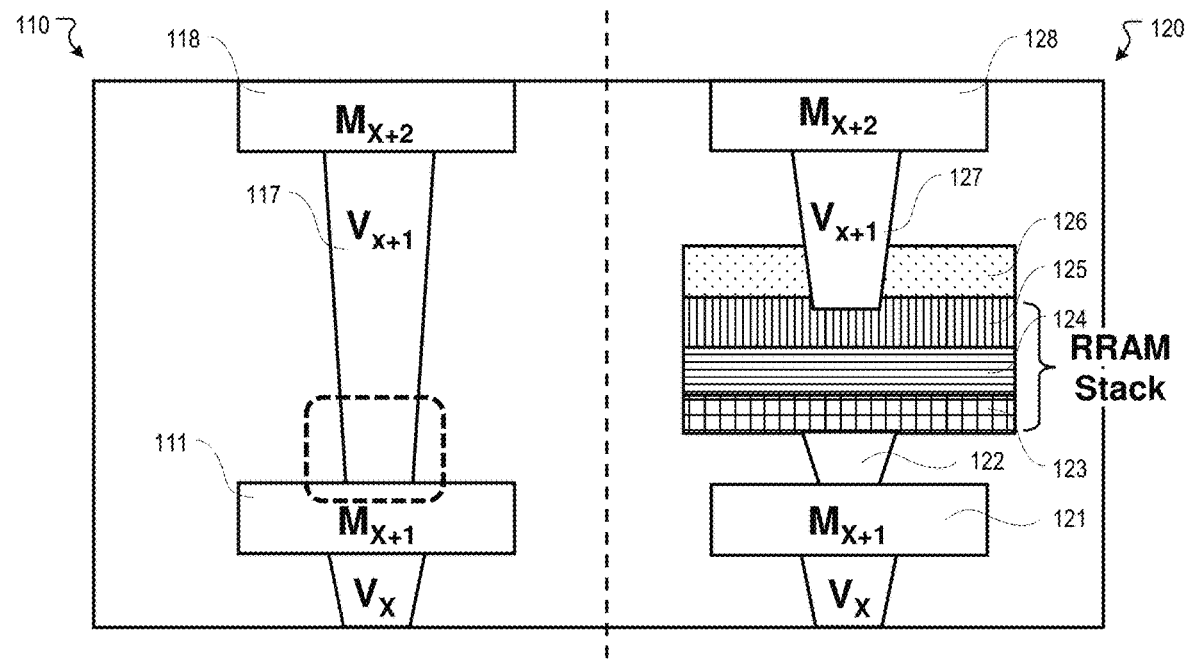
FIG. 1 is a schematic diagram illustrating an embedded RRAM fabricated in a conventional process.

FIG. 1 shows an embedded RRAM fabricated in a conventional process that requires two or more extra photomasks. The wafer is split into non-RRAM region 110 and RRAM region 120. In this example, the RRAM process starts at metal layer $M_{x+1}$ 111 and 121. Interlayer dielectric (ILD) is then deposited and followed by a first lithography patterning. In the first lithography process, a first photomask is used to pattern RRAM bottom electrode (BE) 122 in the RRAM region 120. The wafer is then subject to RRAM BE material deposition and followed by chemical mechanical polishing (CMP) process and RRAM stack deposition. The RRAM stack includes a dielectric layer 123, a capping layer 124, and a top electrode 125. On top of the RRAM stack, a hard mask layer 126 is also deposited. The wafer is then subject to a second photolithography to define the RRAM cell. In the non-RRAM region, the RRAM stack will be removed. Note, the second lithography process is performed with a RRAM photomask, which is the second photomask used in this process flow. Afterwards, ILD layer deposition and CMP are performed again, and RRAM cell's top electrode 125 is connected to other circuit using standard CMOS backend-of-the-line (BEOL) process flow. In this example, via $V_{x+1}$ 127 and metal layer $M_{x+2}$ 128 is used where via $V_{x+1}$ 127 etches through the hard mask 126 and connects to the RRAM top electrode 125 in the RRAM region 120. In the non-RRAM region 110, via $V_{x+1}$ 117 makes a direct connection with metal layer $M_{x+1}$ 111. In short, this conventional RRAM process requires at least two different photomasks, one for patterning the RRAM bottom electrode, and one for patterning the RRAM cell.

As shown in FIG. 1, conventional processes generally require two or more different photomasks for embedded memory, which significantly increases the costs of implementing embedded memory, and there is an urgent need to reduce number of different photomasks, thereby reducing the costs of photomasks design, for embedded memory.

Figure 2:
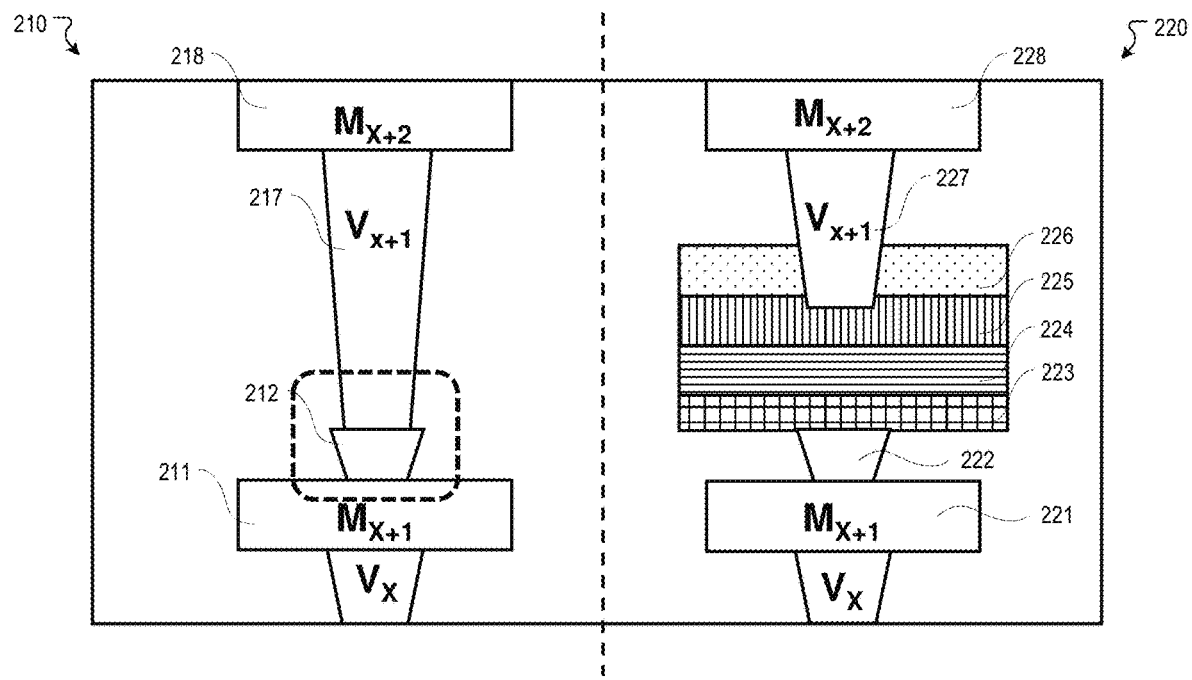
FIG. 2 is a schematic diagram illustrating an embedded RRAM fabricated in a novel process in accordance with embodiments of the present invention.

FIG. 2 is a schematic diagram illustrating an embedded RRAM fabricated in a novel process in accordance with embodiments of the present invention. In accordance with embodiments of the present invention, only one extra photomask is needed to be designed for this new process ("One Mask" process), which can significantly reduce the costs of designing extra photomasks and enable RRAM to be more competitive.

Figures 3A, 3B, 3C:
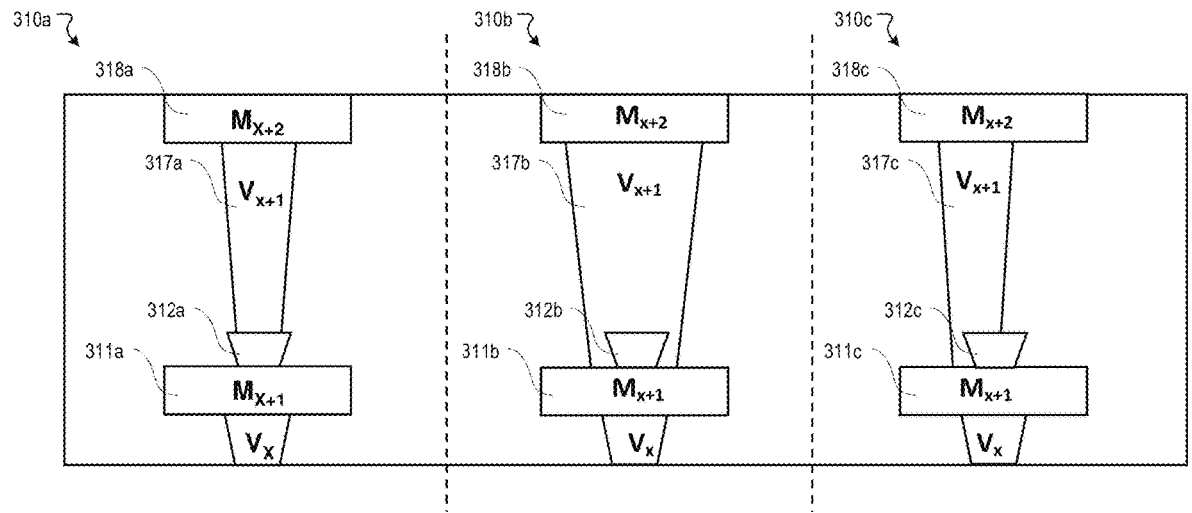
FIG. 3A-FIG. 3C are schematic diagrams illustrating the variation of via and BE connection in the non-RRAM region in the novel process for embedded RRAM in accordance with embodiments of the present invention.

Comparing with the embedded RRAM fabricated in the convention process in FIG. 1, the embedded RRAM fabricated in the One Mask process as shown in FIG. 2 has a difference in terms of via and metal layer connection in the non-RRAM region 210, wherein via $V_{x+1}$ 217 is stacked on top of a conductive structure 212, which is connected to metal layer $M_{x+1}$ 211. Such conductive structure in the non-RRAM region has essentially the same structure as the BE in the RRAM region, and for the sake of convenience, it is referred as BE as well throughout this specification. However, it does not function as a bottom electrode in the non-memory region. FIG. 3A-FIG. 3C are schematic diagrams illustrating the variation of via $V_{x+1}$ and BE connection in the non-RRAM region in the novel process for embedded RRAM in accordance with embodiments of the present invention.

As shown in FIG. 3A, via $V_{x+1}$ 317a is stacked on top of the BE 312a in the non-RRAM region 310a. As shown in FIG. 3B, via $V_{x+1}$ 317b totally encloses BE 312b in the non-RRAM region 310b. As shown in FIG. 3C, via $V_{x+1}$ 317c partially encloses BE 312c in the non-RRAM region 310c.

Figure 4:
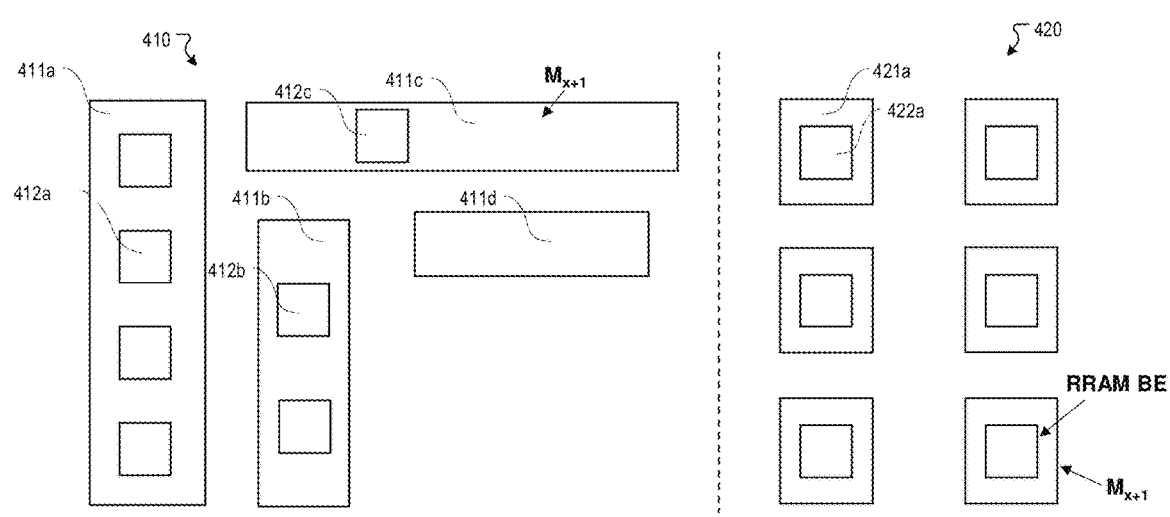
FIG. 4 is a schematic diagram illustrating a top view of the BE in the non-RRAM region and RRAM BE in the RRAM region in the novel process for embedded RRAM in accordance with embodiments of the present invention.

FIG. 4 is a schematic diagram illustrating a top view of the BE in the non-RRAM region and RRAM BE in the RRAM region in the novel process for embedded RRAM in accordance with embodiments of the present invention.

As shown in FIG. 4, in the non-RRAM region 410, there can be 0, 1, or multiple BE on an isolated metal layer $M_{x+1}$. For example, there is 0 BE on the metal layer $M_{x+1}$ 411d. There is 1 BE 412c on the metal layer $M_{x+1}$ 411c. There is 2 BE 412b on the metal layer $M_{x+1}$ 411b. There is 4 BE 412a on the metal layer $M_{x+1}$ 411a. On the contrary, in the RRAM region 420, only 1 RRAM BE 422a sits on an isolated metal layer $M_{x+1}$ 421a.

Figure 5A:
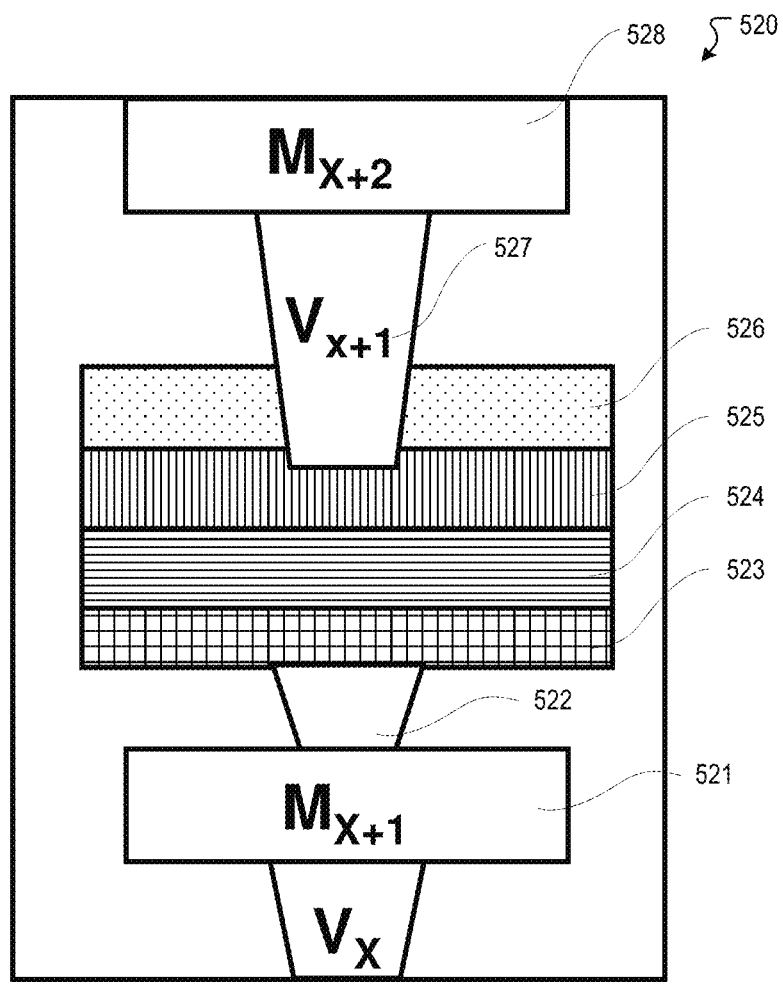
FIG. 5A-FIG. 5B are schematic diagrams illustrating thickness and material of RRAM stack layers in the novel process for embedded RRAM in accordance with embodiments of the present invention.
Figure 5B:
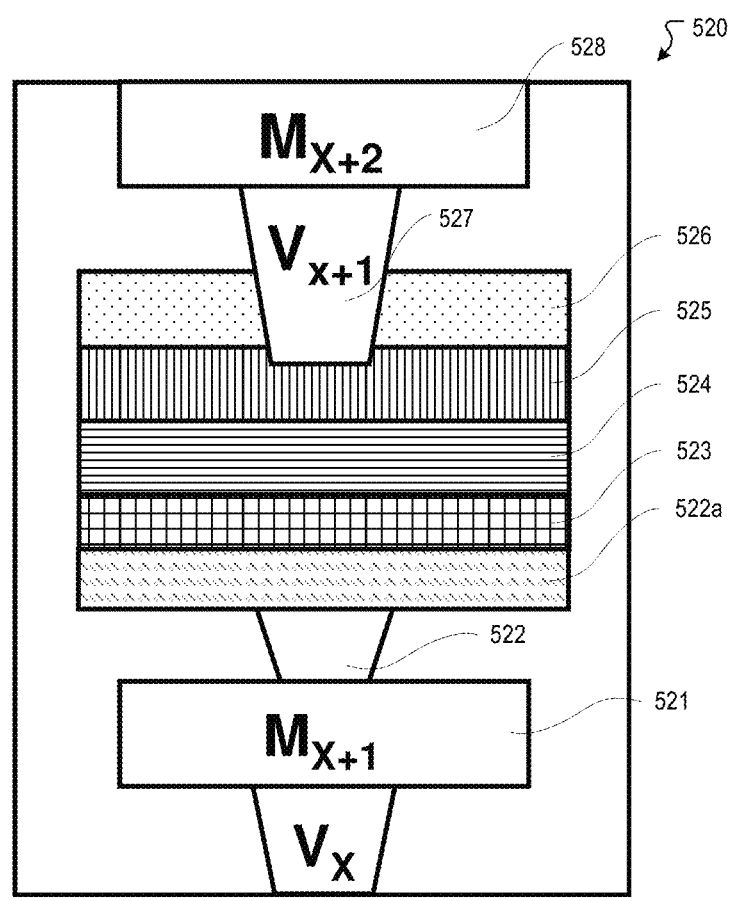

FIG. 5A-FIG. 5B are schematic diagrams illustrating thickness and material of RRAM stack layers in the novel process for embedded RRAM in accordance with embodiments of the present invention.

There can be two types of RRAM stack in the RRAM region 520: (a) RRAM with only one BE material, as shown in FIG. 5A; and (b) RRAM with two bottom electrodes, as shown in FIG. 5B. Referring to FIG. 5A, the thickness of the RRAM BE 522 may be 5 nm-500 nm and the material of the RRAM BE 522 may be metals (Ti, Hf, Ta, Ru, Ir, Pt, etc.), metal oxide (TiOx, TaOx, HfOx, etc), metal nitrides (TiN, TaN, AlN, etc), metal oxynitride (TiON, TaON, AlON, etc), or other suitable conductive materials. The thickness of the dielectric layer 523 may be 0.1 nm-50 nm and the material of the dielectric layer 523 may be dielectric (SiO2, Ta2O5, TiO2, ZrO2, HfO2, Al2O3, etc.), including mixture and/or combination of these materials. The thickness of the capping layer 524 may be 1 nm-500 nm and the material of the capping layer 524 may be metals (Ti, Hf, Ta, Ru, Ir, Pt, etc.), metal oxide (TiOx, TaOx, HfOx, etc), metal nitrides (TiN, TaN, AlN, etc), metal oxynitride (TiON, TaON, AlON, etc), or other suitable conductive materials. The thickness of the top electrode 525 may be 1 nm-500 nm and the material of the top electrode 525 may be metals (Ti, Hf, Ta, Ru, Ir, Pt, etc.), metal oxide (TiOx, TaOx, HfOx, etc), metal nitrides (TiN, TaN, AlN, etc), metal oxynitride (TiON, TaON, AlON, etc), or other suitable conductive materials. The material of the hard mask layer 126 may be SiN.

Referring to FIG. 5B, there is a second RRAM BE 522a deposited between the dielectric layer 523 and the first RRAM BE 522. The thickness of the second RRAM BE 522a may be 1 nm-500 nm and the material of the second RRAM BE 522a may be metals (Ti, Hf, Ta, Ru, Ir, Pt, etc.), metal oxide (TiOx, TaOx, HfOx, etc), metal nitrides (TiN, TaN, AlN, etc), metal oxynitride (TiON, TaON, AlON, etc), or other suitable conductive materials.

FIG. 6A-FIG. 6I are schematic diagrams illustrating a novel process flow for embedded RRAM in accordance with embodiments of the present invention. The novel process flow may include the following steps.

As shown in FIG. 6A, the wafer can be split into the non-RRAM region 610 and the RRAM region 620. In this example, RRAM process starts at metal layer $M_{x+1}$.

Interlayer dielectric (ILD) is then deposited (FIG. 6B) and followed by a first lithography patterning of BE in the non-RRAM region 610 and RRAM region 620 (FIG. 6C). Note, in this first lithography patterning, the same photomask used to pattern via $V_{x+1}$ is used to pattern BE in the non-RRAM region 610 and RRAM region 620. That is, no extra photomask is needed in the lithography patterning of BE in the non-RRAM region 610 and RRAM region 620.

The wafer is then subject to BE material deposition (FIG. 6D) and followed by chemical mechanical polishing (CMP) process (FIG. 6E) to deposit BE 622 on top of the metal layer $M_{x+1}$ in the non-RRAM region 610 and RRAM region 620.

As shown in FIG. 6F, the wafer is then subject to RRAM stack deposition. The RRAM stack includes a dielectric layer 623, a capping layer 624, and a top electrode 625. On top of the RRAM stack, a hard mask layer 626 is also deposited.

As shown in FIG. 6G, the wafer is then subject to a second photolithography to define the RRAM cell. In the non-RRAM region 610, RRAM stack will be removed. Note, the second photolithography is performed with a RRAM photomask, which is the only extra photomask used in this process flow.

As shown in FIG. 6H, ILD layer deposition and CMP are performed again.

As shown in FIG. 6I, the connection of RRAM cell's top electrode 625 to other circuits is done with standard CMOS BEOL process flow. In this example, via $V_{x+1}$ 627 and metal layer $M_{x+2}$ 628 is used where via $V_{x+1}$ 627 is etched through the hard mask 626 and connects to the RRAM top electrode 625. In the non-RRAM region 610, via $V_{x+1}$ 617 makes a direct connection with BE 612, which is further connected to the metal layer $M_{x+1}$ 611.

In accordance with embodiments of the president invention, the metal layer $M_{x+1}$ in the memory region and the metal layer $M_{x+1}$ in the non-memory region (such as $M_{x+1}$ 221 and $M_{x+1}$ 211 in FIG. 2) may be formed at the same time using a same metallization process, and the metal layer $M_{x+1}$ in the memory region may be connected to the metal layer $M_{x+1}$ in the non-memory region.

In accordance with embodiments of the president invention, the metal layer $M_{x+2}$ in the memory region and the metal layer $M_{x+2}$ in the non-memory region (such as $M_{x+2}$ 228 and $M_{x+2}$ 218 in FIG. 2) may be formed at the same time using a same metallization process, and the metal layer $M_{x+2}$ in the memory region may be connected to the metal layer $M_{x+2}$ in the non-memory region.

In the proposed process flow described above, taking RRAM memory array being placed between metal layer $M_{x+1}$ and metal layer $M_{x+2}$ as an example, this One Mask process for embedded RRAM utilizes the same photomask used to define via $V_{x+1}$ to define BE in the non-RRAM region 610 and RRAM region 620 (FIG. 6C). In this case, the only extra photomask required is for defining RRAM cell (FIG. 6G). Once the RRAM loop is finished, the photomask used to define via $V_{x+1}$ is used again to depose via $V_{x+1}$ that connects metal layer $M_{x+1}$ to metal layer $M_{x+2}$ through the BE in the non-RRAM region 610 and connects metal layer $M_{x+2}$ to RRAM top electrode in the RRAM region 620 (FIG. 6I).

The process flow in accordance with embodiments of the present invention can be applied to other back-end-of-line (BEOL) memory, including but not limited to, Conductive-Bridge RAM (CBRAM), Magnetic RAM (MRAM), Ferro-electric RAM (FeRAM), and Phase Change RAM (PCRAM).

The novel process technique in accordance with embodiments of the present invention has the advantage of reducing the extra photomask needed for embedded memory to merely 1, thus significantly reducing mask costs. Comparing with existing embedded memory integration approach, this technique may reduce the photomask cost by more than 50%.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present invention, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

The invention claimed is:

1. A method for manufacturing an integrated circuit comprising:
    defining a memory region and a non-memory region on a semiconductor wafer;
    depositing a first interlayer dielectric layer on a first bottom metal layer in the memory region and a second bottom metal layer in the non-memory region;
    forming a first conductive structure in the memory region and a second conductive structure in the non-memory region by etching the first interlayer dielectric layer using a first photolithography process comprising a first photomask, wherein the first conductive structure is configured to be a first bottom electrode in the memory region;
    depositing a memory stack layer in the memory region and the non-memory region;
    forming a memory element in the memory region by etching the memory stack layer using a second photolithography process comprising a second photomask;
    depositing a second interlayer dielectric layer in the memory region and the non-memory region; and
    forming a first via in the memory region and a second via in the non-memory region by etching the second interlayer dielectric layer using a third photolithography process comprising a third photomask, wherein the first photomask and the third photomask comprise a same pattern.

2. The method of claim 1, wherein the memory stack layer comprises:
    a dielectric layer;
    a capping layer; and
    a top electrode layer.

3. The method of claim 2, where the memory stack layer further comprises:
    a bottom electrode layer.

4. The method of claim 1, further comprising:
    forming the first bottom metal layer in the memory region and the second bottom metal layer in the non-memory region using a first metallization process.

5. The method of claim 4, further comprising:
    forming a first top metal layer in the memory region and a second top metal layer in the non-memory region using a second metallization process.

* * * * *